US008082382B2

(12) United States Patent
Roohparvar

(10) Patent No.: US 8,082,382 B2
(45) Date of Patent: Dec. 20, 2011

(54) MEMORY DEVICE WITH USER CONFIGURABLE DENSITY/PERFORMANCE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 390 days.

(21) Appl. No.: 10/861,646

(22) Filed: Jun. 4, 2004

(65) Prior Publication Data

US 2005/0273549 A1 Dec. 8, 2005

(51) Int. Cl.
*G06F 12/00* (2006.01)
*G11C 16/26* (2006.01)
(52) U.S. Cl. ............. 711/103; 365/185.03; 365/189.011
(58) Field of Classification Search ............. 365/185.03, 365/189.011
See application file for complete search history.

(56) References Cited

U.S. PATENT DOCUMENTS

| 6,349,395 | B2 | 2/2002 | Ohuchi |
| 6,353,553 | B1 * | 3/2002 | Tamada et al. ........... 365/185.03 |
| 6,363,008 | B1 | 3/2002 | Wong |
| 6,466,476 | B1 | 10/2002 | Wong et al. |
| 6,542,909 | B1 * | 4/2003 | Tamer et al. .................. 707/205 |
| 6,640,262 | B1 | 10/2003 | Uppunda |
| 6,662,285 | B1 | 12/2003 | Douglass |
| 7,535,759 | B2 | 5/2009 | Roohparvar |
| 2001/0038553 | A1 * | 11/2001 | Parker et al. ............. 365/185.03 |
| 2002/0054504 | A1 * | 5/2002 | Micheloni et al. ....... 365/185.03 |
| 2002/0057595 | A1 * | 5/2002 | Kobayashi et al. ...... 365/185.03 |
| 2002/0144103 | A1 * | 10/2002 | Kendall ........................... 713/1 |
| 2003/0041210 | A1 * | 2/2003 | Keays ........................ 711/103 |
| 2003/0131185 | A1 * | 7/2003 | Dover ......................... 711/103 |
| 2003/0165076 | A1 * | 9/2003 | Gorobets et al. ............. 365/200 |
| 2009/0213655 | A1 | 8/2009 | Roohparvar |

* cited by examiner

*Primary Examiner* — Kaushikkumar Patel
(74) *Attorney, Agent, or Firm* — Leffert Jay & Polglaze, P.A.

(57) ABSTRACT

The memory device is comprised of a memory array having a plurality of memory cells that are organized into memory blocks. Each memory cell is capable of storing a selectable quantity of data bits (e.g., multiple level cells or a single bit per cell). Control circuitry controls the density configuration of read or write operations to the memory blocks in response to a configuration command. In one embodiment, the configuration command is part of the read or write command. In another embodiment, the configuration command is read from a configuration register.

24 Claims, 4 Drawing Sheets

MEMORY DEVICE WITH USER CONFIGURABLE DENSITY/PERFORMANCE

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The present trend of electronic devices is increased performance at reduced cost. The component manufacturers, therefore, must continue to increase the performance of their devices while decreasing the cost to manufacture them.

One way to increase a flash memory device's density while lowering its manufacturing cost is to use multiple level cells (MLC). Such a device stores two logical bits per physical cell. This reduces the overall cost of the memory. NAND flash memory devices are designed to operate in either one of two configurations on the same die: single bit per cell (SBC) or MLC. The selection of the configuration is done at the factory when the die is manufactured through a metal mask or a programmable fuse option.

However, an MLC die, while having improved cost versus density, has drawbacks relative to performance. Both the programming and read operations can become slower for an MLC die. Therefore, the user typically has to choose between having high memory density at low cost and lower memory density with higher performance.

For the reasons stated above, and for other reasons stated below which will become apparent to those skilled in the art upon reading and understanding the present specification, there is a need in the art for a memory device that combines the attributes of both MLC and SBC devices.

SUMMARY

The above-mentioned problems with memory density and performance and other problems are addressed by the present invention and will be understood by reading and studying the following specification.

The embodiments of the present invention encompass a memory device that has user selectable MLC and SBC memory density options. Different memory blocks of the device can be assigned a different memory density.

The memory device is comprised of a memory array having a plurality of memory cells. Each memory cell is capable of storing a selectable quantity of data bits (e.g., MLC or SBC). Control circuitry controls the density configuration of read or write operations to the memory blocks in response to a configuration command.

In one embodiment, the memory density configuration is received as part of the read or write command. For example, special high density read and write commands can be used when high density/low performance is desired. Normal read and write commands can be used when single density/high performance is desired.

In another embodiment, a configuration register contains configuration bits that each correspond to a memory block of the array. The configuration data can then be preloaded into the register during an initialization operation.

Further embodiments of the invention include methods and apparatus of varying scope.

DETAILED DESCRIPTION

Figure 1:
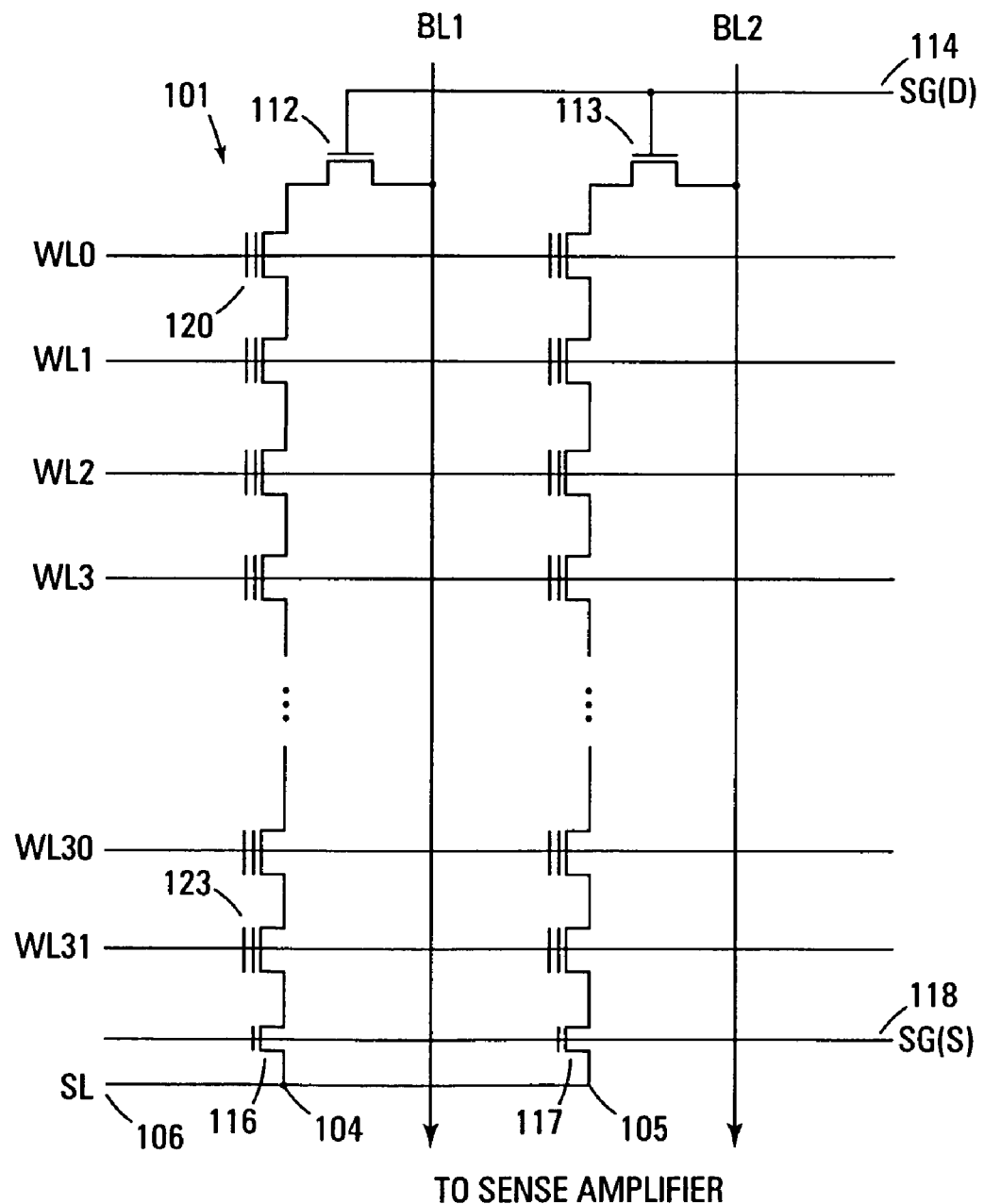
FIG. 1 shows a diagram of one embodiment of a NAND flash memory array of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a NAND flash array is comprised of an array of floating gate cells 101 arranged in series strings 104, 105. Each of the floating gate cells are coupled drain to source in the series chain 104, 105. Word lines (WL0-WL31) that span across multiple series strings 104, 105 are coupled to the control gates of every floating gate cell in order to control their operation. The memory array is arranged in row and column form such that the word lines (WL0-WL31) form the rows and the bit lines (BL1-BL2) form the columns.

In operation, the word lines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1-BL2) by a drain select gate 112, 113. The source select gates 116, 117 are controlled by a source select gate control line SG(S) 118 coupled to their control gates. The drain select gates 112, 113 are controlled by a drain select gate control line SG(D) 114.

The memory cells illustrated in FIG. 1 can be operated as either single bit cells (SBC) or multilevel cells (MLC). Multilevel cells greatly increase the density of a flash memory device. Such cells enable storage of multiple bits per memory cell by charging the floating gate of the transistor to different levels. MLC technology takes advantage of the analog nature of a traditional flash cell by assigning a bit pattern to a specific voltage range stored on the cell. This technology permits the storage of two or more bits per cell, depending on the quantity of voltage ranges assigned to the cell.

For example, a cell may be assigned four different voltage ranges of 200 mV for each range. Typically, a dead space or guard band of 0.2V to 0.4V is between each range. If the voltage stored on the cell is within the first range, the cell is storing a 00. If the voltage is within the second range, the cell is storing a 01. This continues for as many ranges are used for the cell.

The embodiments of the present invention may refer to the MLC as a high density configuration. The embodiments of the present invention are not limited to two bits per cell. Some embodiments may store more than two bits per cell, depending on the quantity of different voltage ranges that can be differentiated on the cell. Therefore, the term high density generally refers to any density beyond single bit cells.

Figure 2:
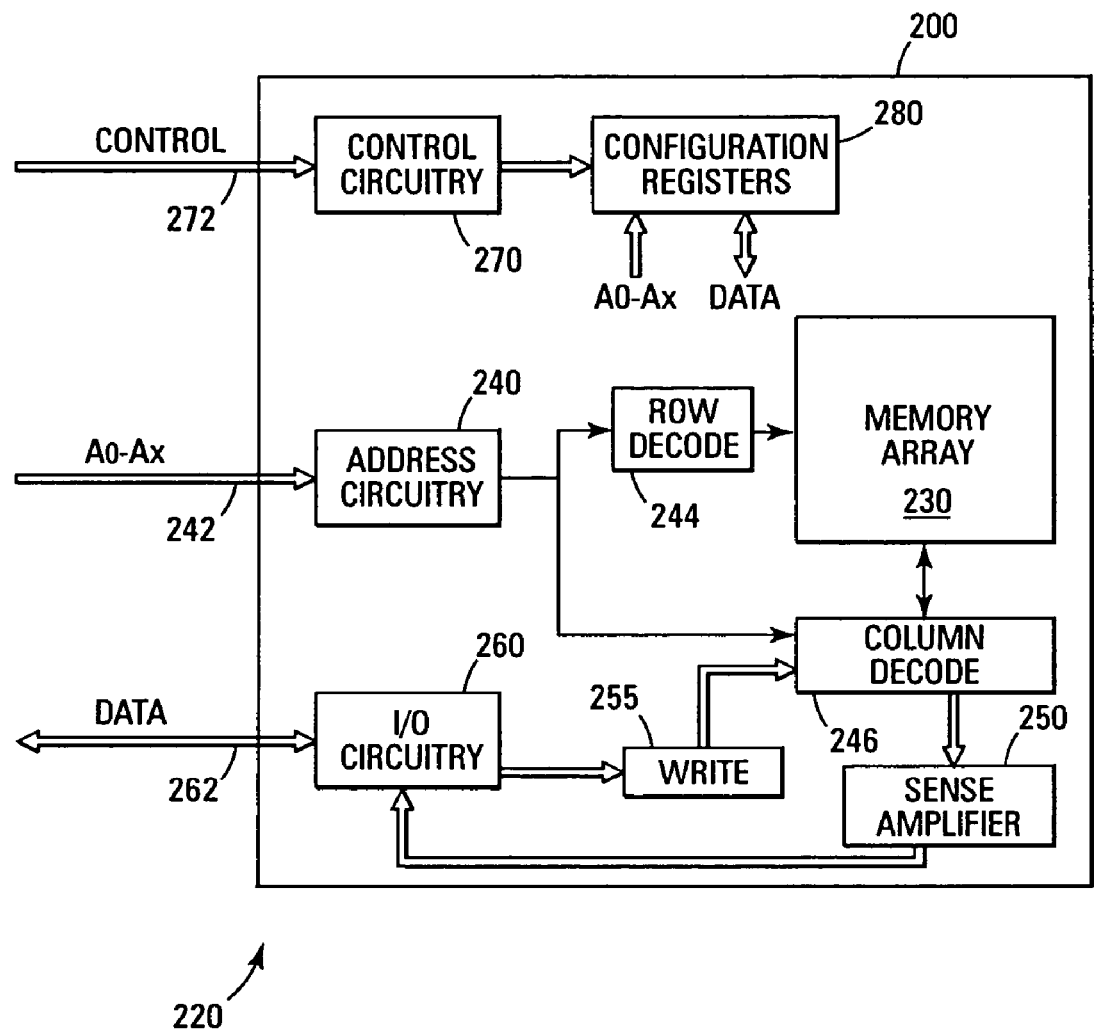
FIG. 2 shows a block diagram of one embodiment of a flash memory device of the present invention that incorporates the memory array of FIG. 1.

FIG. 2 illustrates a block diagram of one embodiment of a flash memory device 200 of the present invention that incorporates the memory array illustrated in FIG. 1. The memory device 200 has been simplified to focus on features of the memory that are helpful in understanding the present invention. A more detailed understanding of internal circuitry and functions of flash memories are known to those skilled in the art.

The memory device 200 includes an array of flash memory cells 230 as discussed previously. The cells of the memory array 230 can be grouped into memory blocks. In one embodiment, a memory block is comprised of 512 bytes in a row by 32 rows. Alternate embodiments are comprised of memory blocks having different quantities of memory cells.

An address buffer circuit 240 is provided to latch address signals provided on address input connections A0-Ax 242. Address signals are received and decoded by a row decoder 244 and a column decoder 246 to access the memory array 230. It will be appreciated by those skilled in the art, with the benefit of the present description, that the number of address input connections depends on the density and architecture of the memory array 230. That is, the number of addresses increases with both increased memory cell counts and increased bank and block counts.

The memory device 200 reads data in the memory array 230 by sensing voltage or current changes in the memory array columns using sense amplifier/buffer circuitry 250. The sense amplifier/buffer circuitry, in one embodiment, is coupled to read and latch a row of data from the memory array 230. Data input and output buffer circuitry 260 is included for bidirectional data communication over a plurality of data connections 262 with the controller 210. Write circuitry 255 is provided to write data to the memory array.

Control circuitry 270 decodes signals provided on a control bus 272. These signals are used to control the operations on the memory array 230, including single density data read and write, high density data read and write, and erase operations. The control circuitry 270 may be a state machine, a sequencer, or some other type of controller. The control circuitry 270, in one embodiment, is responsible for executing the embodiments of the methods of the present invention for configuring the memory blocks as high or single density.

The control circuitry 270 can also program the configuration registers 280 in which, in one embodiment, the high/single density configuration bits of the present invention can reside. This register may be a non-volatile, programmable fuse apparatus, a volatile memory array, or both. The configuration register 280 can also hold other data such as trimming data, memory block lock data, record keeping data for the memory device, and other data required for operation of the memory device.

Figure 3:
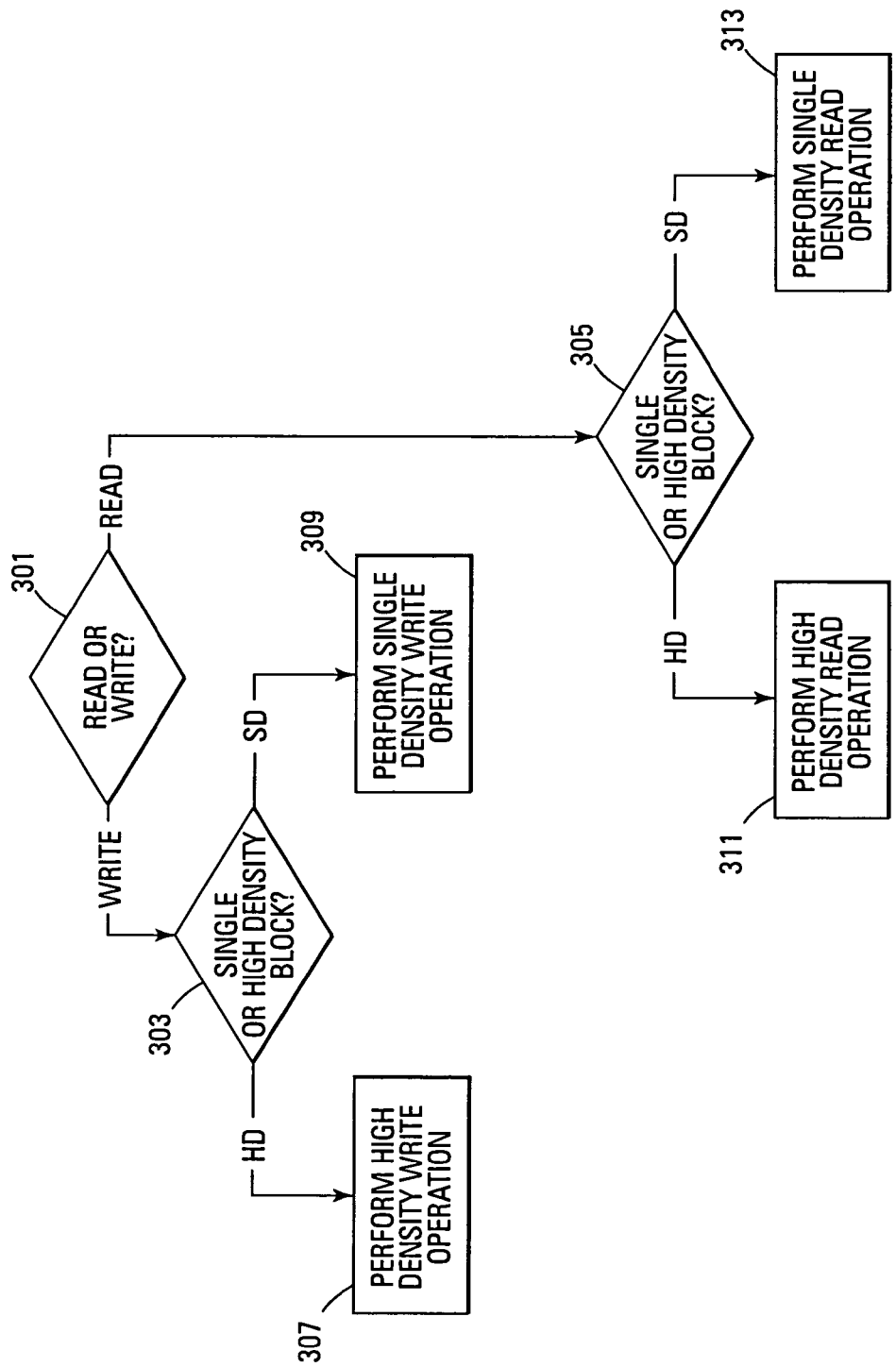
FIG. 3 shows a flowchart of one embodiment of a method for configuring the density/performance of a memory device.

FIG. 3 illustrates a flowchart of one embodiment of a method for configuring the density/performance of a memory device. This embodiment uses special write and read commands to perform high density program and read operations. This embodiment puts the burden on the memory control circuitry to determine the density/performance configuration for a particular memory block. By having the control circuitry perform this task, the memory device does not require any extra hardware in order to switch blocks between high density and single density. The controller tracks the density/performance level.

This embodiment uses two sets of algorithms—one for SBC reading and writing and another for MLC reading and writing. A higher level routine determines which set of algorithms to use depending on the received command. In this embodiment, the erase operation is substantially similar for each memory density.

The method determines if the received command is a read or write command 301. If a write command was received, it is determined 303 whether the command is a single density write command or a special high density write command. A high density write command 307 causes the controller circuitry to program the specified memory block with two or more bits per cell. A single density write command 309 causes the controller circuitry to program the specified memory block with one bit per cell.

If the received command is a read command, it is determined 305 whether the command is a single density read command or a high density read command. If the command is a high density read command 311, the memory block was previously programmed as an MLC cell and is, therefore, read with a high density read operation. A single density configuration read command causes the memory block to be read 313 assuming it was programmed as an SBC.

Figure 4:
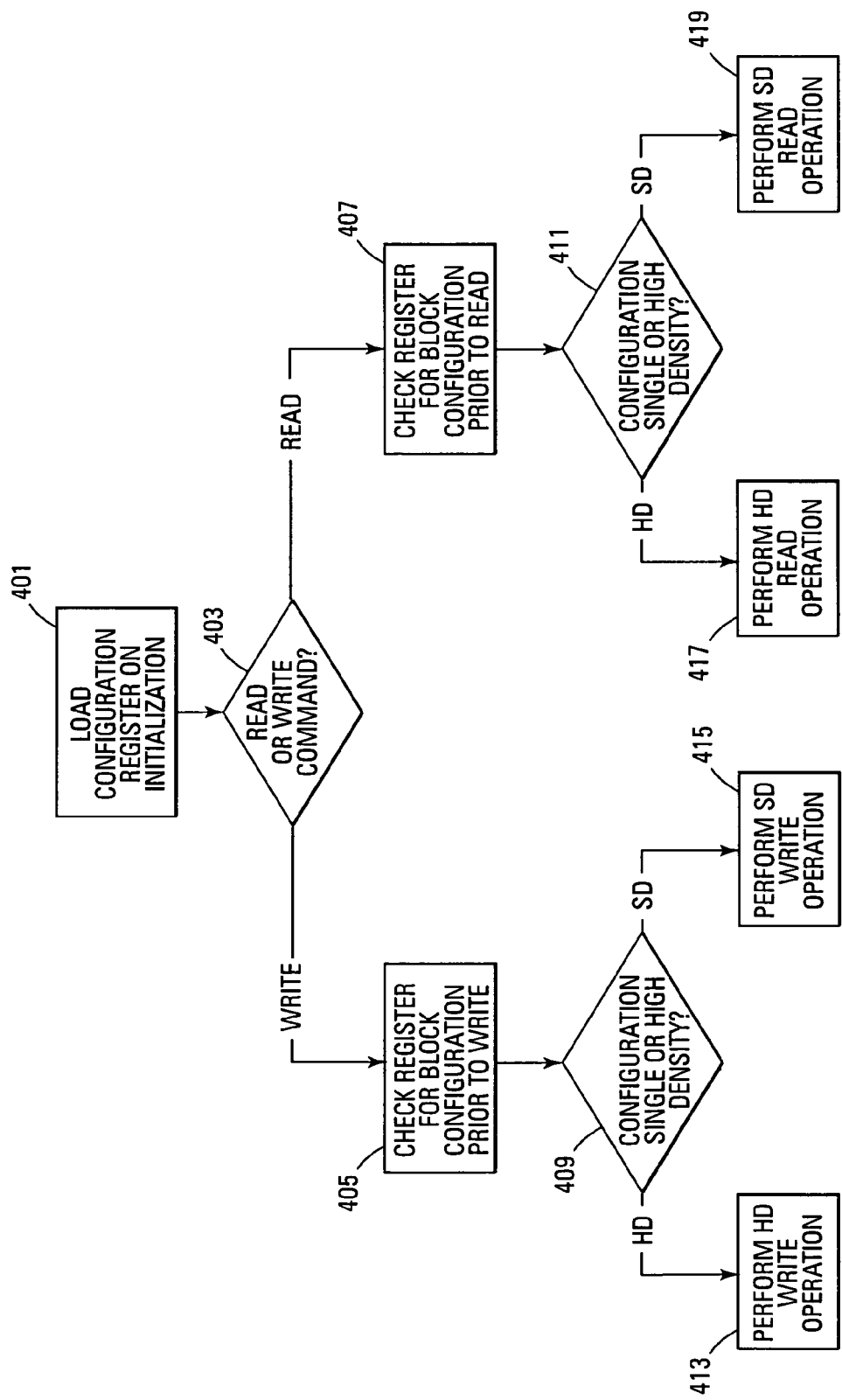
FIG. 4 shows a flowchart of another embodiment of a method for configuring the density/performance of a memory device.

In another embodiment of the present invention, illustrated in FIG. 4, a configuration register is used to pre-assign blocks of memory to the SBC or MLC configuration of operation. This could occur when the system is initialized. This embodiment would not require special commands than those used in MLC or SBC flash memory devices. Additionally, an existing register could be used to store the configuration data so that additional hardware is not required or, in another embodiment, a dedicated configuration register could be added to the memory device.

In one embodiment, the register of the present invention has a bit for every memory block for indicating the operating mode (e.g., MLC or SBC) of that particular block. For example, a logical 1 stored in the memory block 0 configuration bit would indicate that the block is an SBC block while a logical 0 would indicate the block is operating as an MLC block. In another embodiment, these logic levels are reversed.

Alternate embodiments can assign different quantities of blocks to each bit of the configuration register. For example, the register may have a configuration bit assigned to more than one memory block. Additionally, a configuration bit may be assigned to the sub-block level such that each block has multiple configuration bits.

In one embodiment, row 0 of the flash memory device of the present invention is a configuration row. At initialization and/or power-up of the device, the configuration data from row 0 is loaded into the configuration register 401.

When a command is received, it is determined whether it is a read or write command 403. For a read command, the configuration register is checked prior to the read operation to determine if the memory block has been assigned a high density or single density configuration 407. In a single density configuration 411, a single density read operation is performed 419. In a high density configuration 411, a high density read operation is performed 417.

If a write command was received, the configuration register is checked prior to write operation to determine if the memory block has been assigned a high density or a single density configuration 409. In a single density configuration 409, a single density write operation is performed 415. In a high density configuration 409, a high density write operation is performed 413.

In the embodiment of FIG. 4, the user determines the configuration of each block, or other memory cell grouping, and stores this data into the configuration register. When the memory device is powered down, the data in the configuration register is copied to row 0 for more permanent storage in non-volatile memory. In another embodiment, the user can store the configuration directly to the non-volatile, configuration row of the memory device.

The flash memory of the present invention is comprised of memory blocks that can each be configured to store data in different densities. For example, one use of a single memory device might be to store both pictures and code. The picture data is more tolerant of corrupted data than the storage of code. Therefore, since the SBC configuration has a higher reliability than the MLC configuration, the user would typically choose the SBC configuration for the code storage and the MLC configuration for the picture storage.

Similarly, since the MLC configuration might be eight to nine times slower in read and programming performance as compared to the SBC configuration, the user might choose the MLC configuration for memory blocks requiring faster read/write times. This could be useful in a system having fast bus speeds requiring fast storage and retrieval times.

CONCLUSION

In summary, the embodiments of the present invention enable a memory device user to select between an MLC and an SBC configuration. Different configurations can be set up for different memory blocks or even to the sub-block level. Additionally, the configuration changes can be performed dynamically with configuration commands.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device having selectable density configurations, the device comprising:
    a memory array comprising a plurality of memory cells, each memory cell configured to store a selectable quantity of data bits, the memory array organized into memory blocks; and
    control circuitry, coupled to the memory array, that controls selection of the density configuration in response to a configuration command that is received in one of a write command or a read command comprising density configuration information wherein the control circuitry is configured to execute one of two different read and write routines in response to the density configuration information and the control circuitry is further configured to store the density configuration information in a volatile configuration register and transfer the density configuration information to non-volatile memory at power down, wherein the configuration register is configured to be loaded from an initial row of the memory array, and further wherein each memory block is assigned a plurality of configuration bits of the configuration register such that each memory block is configured to have multiple densities.

2. The device of claim 1 wherein the memory device is a NAND flash memory device.

3. The device of claim 1 wherein the configuration command is a configuration bit stored in a configuration register.

4. The device of claim 1 wherein the selectable density configurations include a single bit cell and a multiple level cell.

5. The device of claim 1 wherein the configuration register comprises a plurality of configuration bits, each configuration bit indicating the density configuration of a predetermined quantity of memory cells.

6. The device of claim 5 wherein a configuration bit comprising a logical one indicates a single bit cell density configuration and a logical zero indicates a multiple level cell configuration.

7. A NAND flash memory device having selectable density configurations, the device comprising:
    a memory array comprising a plurality of memory cells that are organized into predetermined memory blocks, each memory cell configured to store a selectable quantity of data bits;
    control circuitry, coupled to the memory array, that determines the density configuration for a predetermined set of memory cells in response to a density configuration bit that is received in one of a write command or a read command comprising configuration information wherein the control circuitry is configured to execute one of two different read/write processes in response to the density configuration bit; and
    a configuration register, coupled to the control circuitry, for storing the density configuration bit wherein the configuration register is comprised of non-volatile memory and volatile memory and the control circuitry is configured to move the density configuration bit between the non-volatile memory and the volatile memory of the configuration register in response to a power condition of the NAND flash memory device, wherein the configuration register is further configured to be loaded from an initial row of the memory array and each predetermined memory block is assigned a plurality of density configuration bits.

8. The memory device of claim 7 wherein the control circuitry is a state machine.

9. The memory device of claim 7 wherein the predetermined sets are memory blocks.

10. A semiconductor, non-volatile memory device having a plurality
    of selectable density configurations, the device comprising:
    a memory array comprising a plurality of memory cells grouped into memory blocks,
        each memory cell configured to store a selectable quantity of data bits;

a control bus for receiving density configuration commands that are included in read and write commands; and control circuitry, coupled to the control bus, that controls the density configuration of each predetermined set in response to a received density configuration command, wherein the control circuitry is configured to execute one of either single bit per cell read and write routines or multiple level cell read and write routines in response to the density configuration command such that the control circuitry is configured to execute a high level routine to interpret the density configuration command and wherein the control circuitry is further configured to store the density configuration commands in a register comprising both volatile and non-volatile memory such that the density configuration commands can be moved from the volatile to the non-volatile memory and the non-volatile to the volatile memory in response to a power condition of the memory device, the control circuitry further configured to load the register from an initial row of the memory array upon power-up of the memory device, and further wherein each memory block is assigned a plurality of density configuration commands such that each memory block is configured to have multiple density configurations.

11. The memory device of claim 10 wherein the selectable quantity of data bits includes a single data bit and two data bits.

12. The memory device of claim 10 wherein the density configuration commands comprise at least one of a high density write operation and a high density read operation.

13. A method for configuring performance of a memory array,
organized as memory blocks, in a semiconductor memory device, the memory device comprising control circuitry coupled to a configuration register, the method comprising:
loading a predetermined row of the memory array into the configuration register in response to an initialization of the memory device;
receiving one of a read or a write command that includes density configuration data;
loading the density configuration data into a volatile portion of the configuration register that comprises both volatile and non-volatile portions;
setting a performance configuration for at least a subset of the memory array in response to the density configuration data, wherein each memory block is configured to have a plurality of density configurations; and
reading and writing to the memory array using one of a single bit per cell read and write routine or a multiple level cell read and write routine in response to the density configuration data.

14. The method of claim 13 wherein the performance configuration comprises one of high density/low performance or single density/high performance.

15. The method of claim 13 wherein setting the performance configuration comprises setting the performance configuration for all of the memory cells in the memory array.

16. A method for configuring performance of a memory array in a semiconductor memory device, the method comprising:
loading a configuration register with data from a predetermined initial row of the memory array upon an initialization of the memory device;
receiving configuration data in either a read command or a write command;
setting a performance configuration for at least a memory block of the memory array having a plurality of memory blocks in response to the received configuration data;
executing a high level routine for determining, in response to the received configuration data, whether to use one of a single bit per cell read write routine or a multiple level cell read and write routine; and
storing the received configuration data to a non-volatile location of the configuration register, comprising both the non-volatile location and a volatile location, in response to a power-down of the memory device wherein each memory block is configured to be assigned multiple configuration data.

17. The method of claim 16 wherein the received configuration data includes one of high performance or low performance.

18. The method of claim 17 wherein the high performance configuration sets the subset of the memory array to single bit per cell density.

19. The method of claim 17 wherein the low performance configuration sets the subset of the memory array to multiple levels per cell.

20. A method for configuring the density of a memory array,
organized as memory blocks, in a semiconductor memory device, the memory array comprising a plurality of memory cells grouped into predetermined subsets of cells, the method comprising:
loading a configuration register with data from a predetermined row of the memory array upon an initialization of the memory device;
receiving a command for initiating one of a read or a write operation on the predetermined subset of cells;
determining if the command contains a memory density configuration;
a high level routine determining whether to use a single bit per cell read/write routine or a multiple level cell read/write routine in response to the memory density configuration;
executing one of the single level cell read/write routine or the multiple level cell read/write routine on the predetermined subset of cells at the memory density configuration specified in the command; and
storing the memory density configuration from the command in either a volatile or a non-volatile location of the configuration register in response to a power configuration of the memory device, wherein the configuration register comprises both the volatile and the non-volatile locations, further wherein each memory block is configured to have multiple memory density configurations.

21. The method of claim 20 wherein the predetermined subsets of cells are 512 byte by 32 row memory blocks.

22. The method of claim 20 wherein the memory density configuration comprises one of a single bit per cell configuration or a multiple level cell configuration.

23. The method of claim 22 wherein the multiple level cell configuration comprises storing a plurality of bits on one memory cell.

24. A memory device having selectable density configurations, the device comprising:
a memory array comprising a plurality of memory cells, each memory cell configured to store a selectable quantity of data bits, the memory array organized into memory blocks; and
control circuitry, coupled to the memory array, that controls selection of the density configuration in response to a configuration command that is received in one of a write command or a read command comprising density configuration information wherein the control circuitry is configured to execute one of two different read and write routines in response to the density configuration information and further wherein each memory block is assigned a plurality of configuration bits of the configuration register such that each memory block is configured to have multiple densities.

* * * * *

UNITED STATES PATENT AND TRADEMARK OFFICE
CERTIFICATE OF CORRECTION

PATENT NO. : 8,082,382 B2  Page 1 of 1
APPLICATION NO. : 10/861646
DATED : December 20, 2011
INVENTOR(S) : Frankie F. Roohparvar It is certified that error appears in the above-identified patent and that said Letters Patent is hereby corrected as shown below:

In column 8, line 6, in Claim 16, delete "read write" and insert -- read/write --, therefor.

Signed and Sealed this
Twenty-seventh Day of March, 2012

David J. Kappos
*Director of the United States Patent and Trademark Office*